United States Patent [19]

Lindgren

[11] Patent Number: 4,507,520

[45] Date of Patent: Mar. 26, 1985

[54] DOUBLE ISOLATED SHIELDING ENCLOSURE

[76] Inventor: Erik A. Lindgren, 4559 Cordoba Way, Oceanside, Calif. 92056

[21] Appl. No.: 574,702

[22] Filed: Jan. 27, 1984

[51] Int. Cl.³ .............................................. H05K 9/00
[52] U.S. Cl. .............................. 174/35 MS; 403/364; 403/398
[58] Field of Search ............ 174/35 MS; 403/88, 213, 403/273, 280, 364, 398

[56] References Cited

U.S. PATENT DOCUMENTS 2,961,478  11/1960  Burns ............................ 174/35 MS
3,783,174   1/1974  Lindgren ....................... 174/35 MS

OTHER PUBLICATIONS

Lindgren, *Contemporary RF Enclosures*, 1967, p. 99.

Primary Examiner—A. T. Grimley
Assistant Examiner—D. A. Tone
Attorney, Agent, or Firm—Gary, Juettner & Pyle

[57] ABSTRACT

A double isolated electrically shielding screen room is characterized in that all of the side, ceiling and floor panels thereof are selectively provided with either male or female configured marginal edges defining tongues and grooves for interconnection of the panels without need for separate shielding strips. Overlapping shielding contacts between connected panels lie in parallel planes and are secured under compression in directions perpendicular to the contacts with great isolation efficiency by outwardly concealed clamping means applied from inside the room assembly, so that floor space around the room is economically conserved. The particular construction minimizes the number of individual elements required for the screen room and facilitates its assembly and disassembly.

8 Claims, 6 Drawing Figures

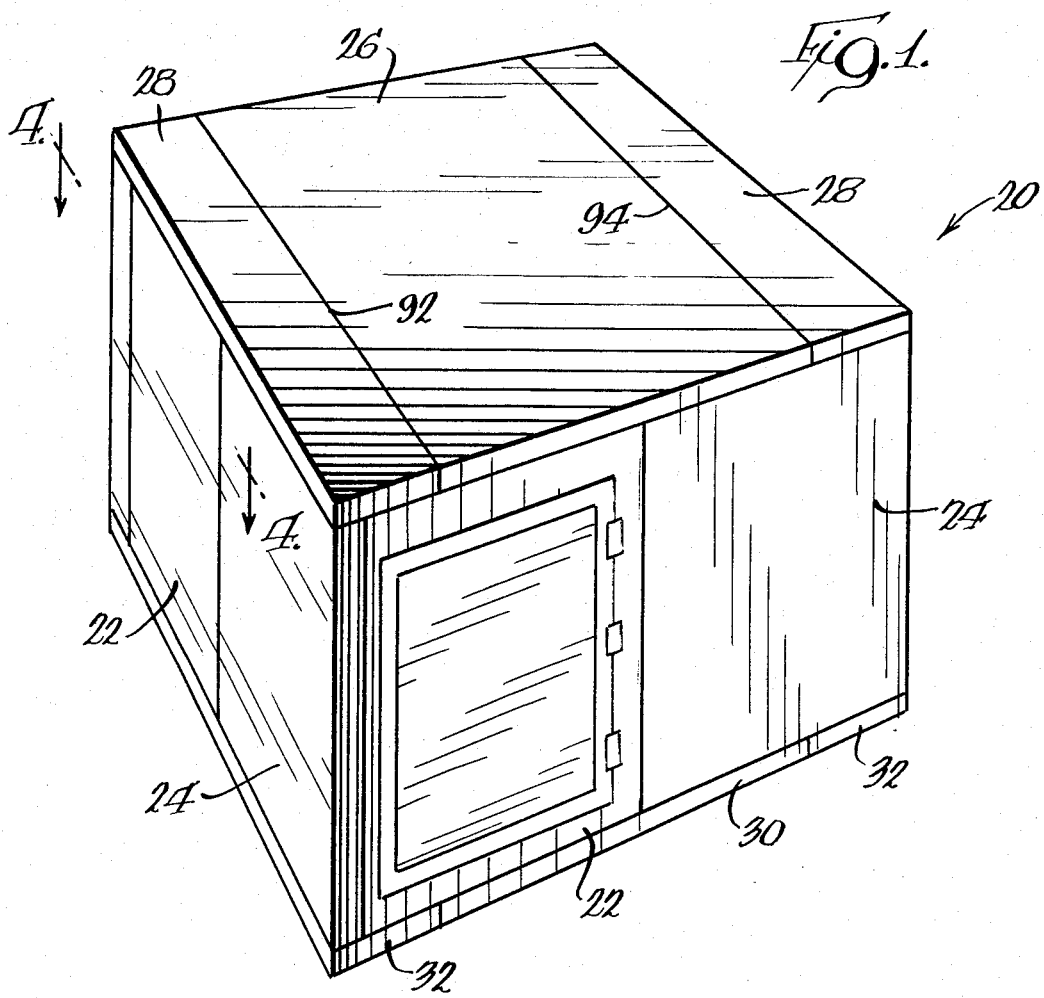
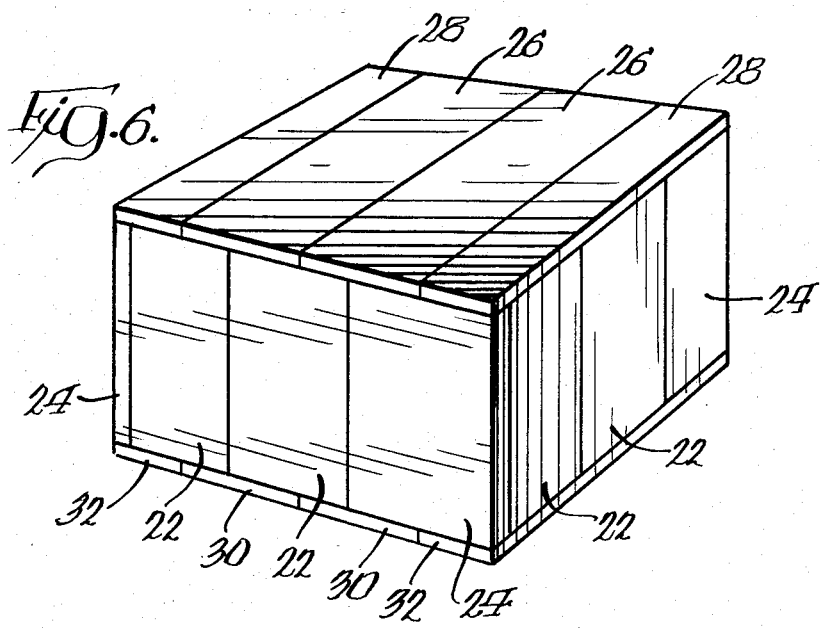

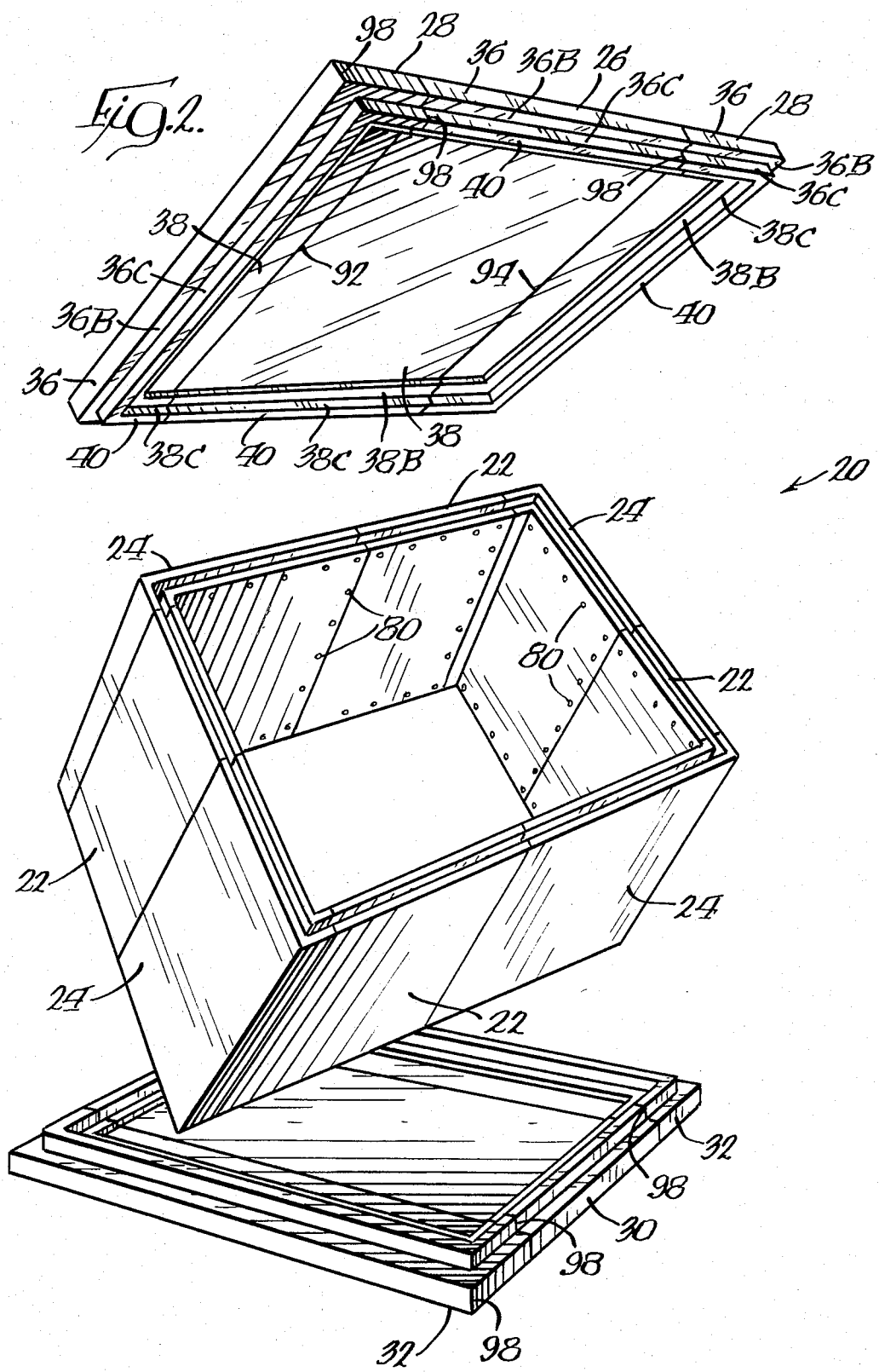

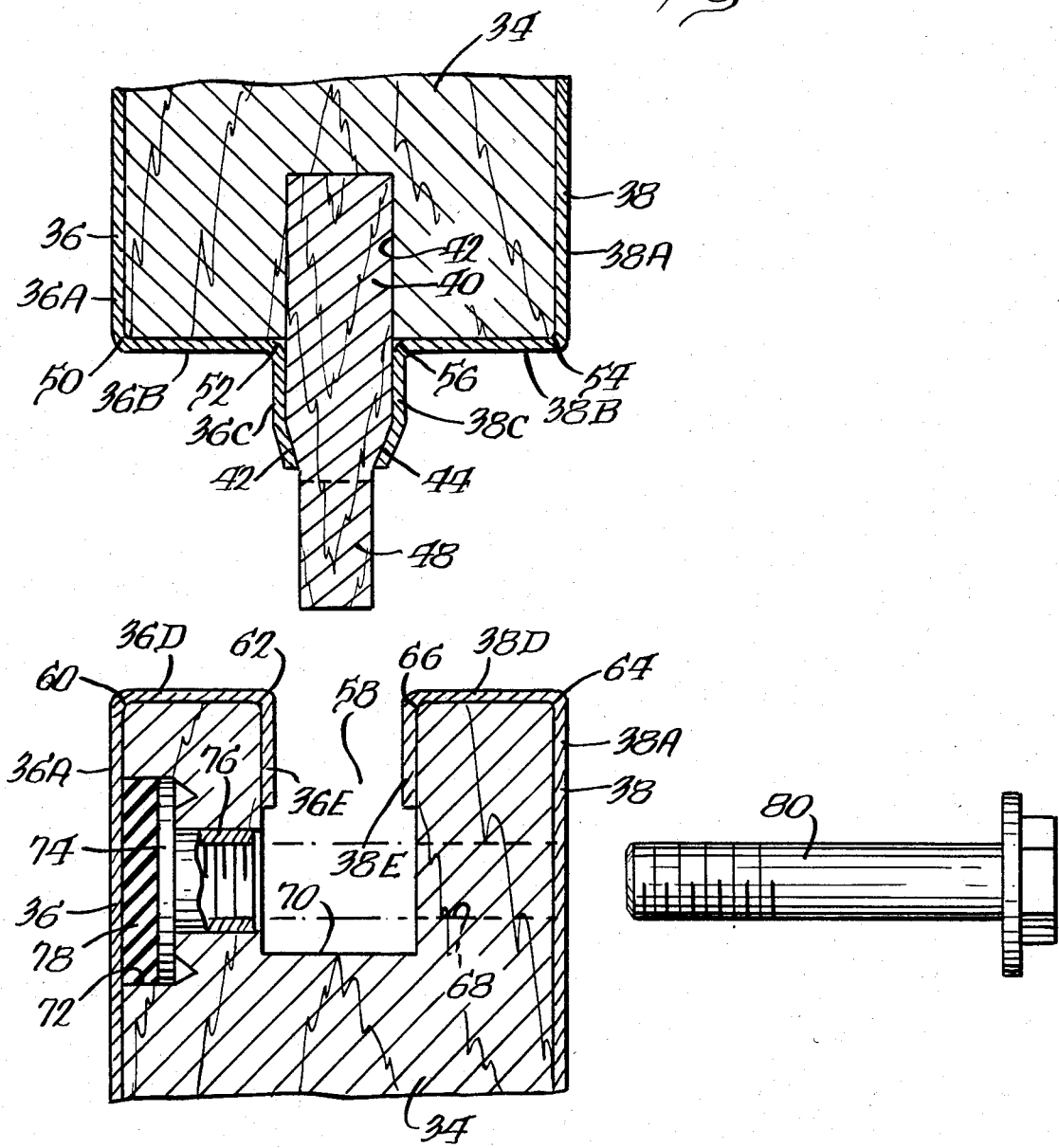

DOUBLE ISOLATED SHIELDING ENCLOSURE

BACKGROUND OF THE INVENTION

The present invention relates to electrically shielding enclosures, commonly referred to as screen rooms, for protection from electrical, electrostatic and magnetic fields, and in particular to an improved construction of such a screen room which requires minimum numbers of elements and enables the room to be readily assembled and disassembled without loss of shielding effectiveness.

Shielding efficiency is related to conductivity and nonpermeability, and it is well known that continuous electrical conductivity between contiguous points in a shielding element affords a pronounced efficiency as a radial wave shield in the intermediate and lower wave bands. However, by utilizing multiple mutually spaced shielding enclosures, the extent of shielding may be further enhanced and extended over a wider range of frequencies.

Various materials are known to possess shielding characteristics which, to some degree, serve the purpose of isolating a space between or against electrical, magnetic and electrostatic wave penetrations. In prior shielded enclosures of this type, a copper mesh screen has conventionally been used and considered an effective shielding material. In construction of a double shielded isolation room, each individual shield must completely encompass the space to be shielded, one within the other, yet maintain continuity of conduction between consecutive sections of the same shield and at the same time maintain electric isolation of the spaced apart shields.

In joining adjacent panels to form a double isolated screen room, it is necessary not only to maintain continuity of conduction between sections of the shields on inner and outer walls of the room as well as electrical isolation between the shields, but also to provide a means for positively securing the panels in tight and rigid relationship. It is also desirable to permit the connection of adjacent panels with a minimum amount of hardware and shielding joining members while at the same time enhancing the effectiveness of the shielded enclosure, and to provide a solid, rigid structure to eliminate the possibility of separation of the panels.

Prior electrically isolating screen rooms have usually been set up with a space around them which was at least temporarily required by workmen at the time of assembling and securing the screen room panels in place from outside the rooms. External assembly on some screen rooms sometimes resulted in an overall shifting of clamped elements in several directions, which inherently tended to loosen pressure contacts desired between shielding screen edges. Leakage spaces that might be undetectable mechanically could occur and variably lower the decibel test rating of some of the rooms that were otherwise identical. Also difficulty could be experienced with externally installing one or more of the ceiling panels to the tops of the side walls. Moreover, for on-site assembly, time and labor for setting up screen rooms has heretofore been quite expensive, particularly when engineering supervision or sorting of many complicated parts, like a puzzle, is required, or complicated joints and fixed assembly sequences are involved.

U.S. Pat. Nos. 3,783,174 and 3,790,696 to the present inventor, the teachings of which are specifically incorporated herein by reference, solved many of the foregoing problems. However, the screen rooms of those patents require a considerable number of members, separate from the side, ceiling and floor panels, which along with fasteners are required to connect the various panels, which adds complexity and expense to the screen room, its assembly and disassembly.

OBJECT OF THE INVENTION

The primary object of the present invention is to provide an improved construction for a prefabricated, multi-panel, double isolated electrically shielding room construction, in which continuity of conduction between panel sections of the same shield is automatically established as the panels are inteconnected, while electric isolation of one shield from the other is maintained, all without need for separate elements other than fasteners.

SUMMARY OF THE INVENTION

In accordance with the present invention, there is provided in a double isolated electrically shielding screen room, at least first and second panels adapted to be interconnected along marginal edges thereof. Said panels include respective first and second frames of electrical insulating material, said first frame has a tongue extending medially along and outwardly of at least one marginal edge thereof and said second frame has a groove extending medially along and inwardly of at least one marginal edge thereof. Shielding covers opposite sides of said frames, said shielding of said first frame terminating in flanges spaced apart and electrically isolated from each other on opposite sides of said tongue and said shielding on said second frame terminating in flanges spaced apart and electrically isolated from each other on opposite sides of said groove. Said tongue and flanges thereon of said first panel are extendable into said groove and flanges therein of said second panel to interconnect said panels along said at least one marginal edge thereof, to electrically connect the flanges on one side of each of said tongue and groove, and to electrically connect the flanges on an opposite side of each of said tongue and groove, whereby said shielding on the same sides of said panels is electrically connected but electrically isolated from said shielding on opposite sides of said panels.

The foregoing and other objects, advantages and features of the invention will become apparent upon a consideration of the following detailed description, when taken in conjunction with the accompanying drawings.

BRIEF DESCRIPTION OF THE DRAWINGS

FIG. 1 is a perspective view of a screen room in accordance with an embodiment of the present invention;

FIG. 2 is an exploded assembly view of the screen room of FIG. 1;

FIG. 3 is a fragmentary cross sectional view of mating edges of a side, ceiling and/or floor panel, showing the same in orientation to be joined;

FIG. 6 is similar to FIG. 1, and illustrates a screen room in accordance with another embodiment of the invention.

DETAILED DESCRIPTION

Figure 4:
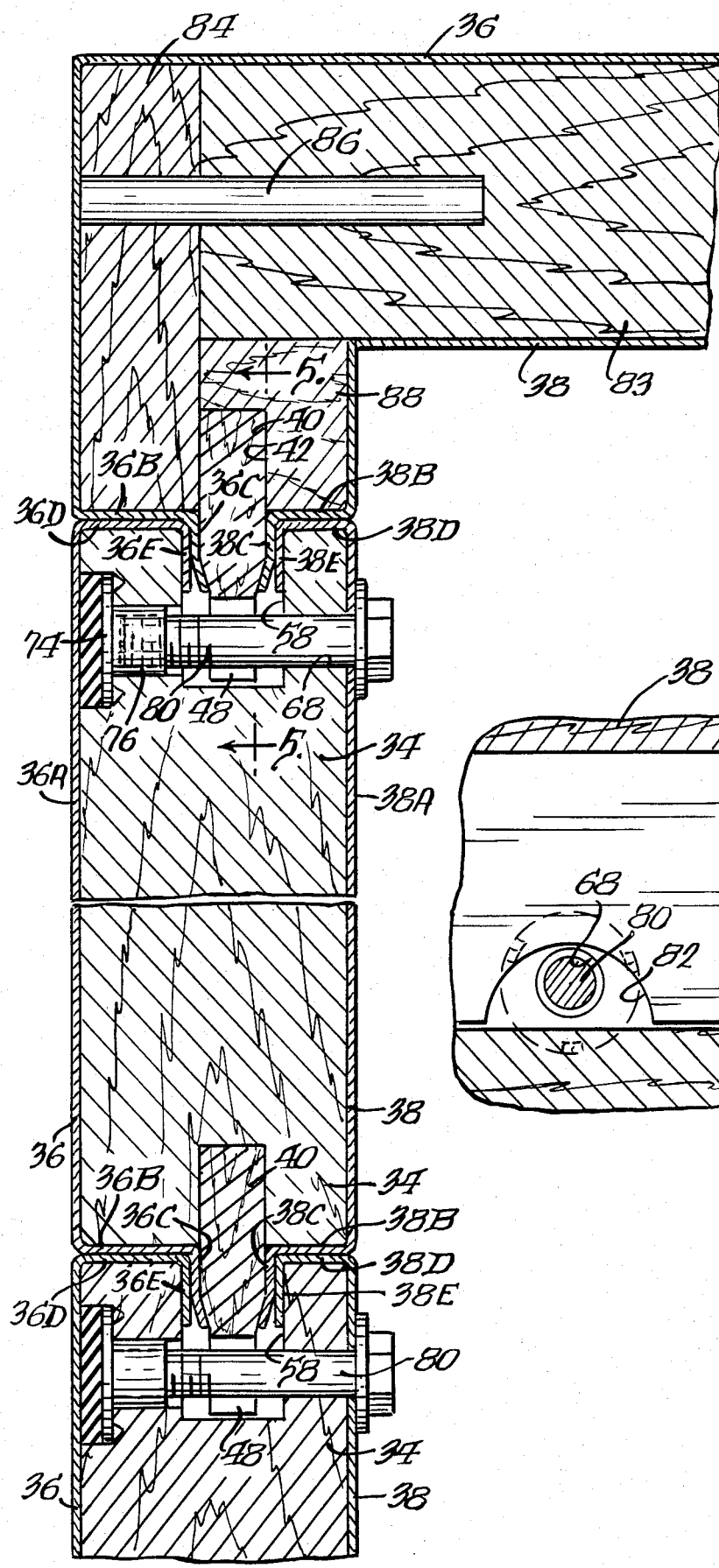
FIG. 4 is a fragmentary cross sectional view of three panels interconnected in tongue and groove fashion and compressibly secured together by fasteners.
Figure 5:
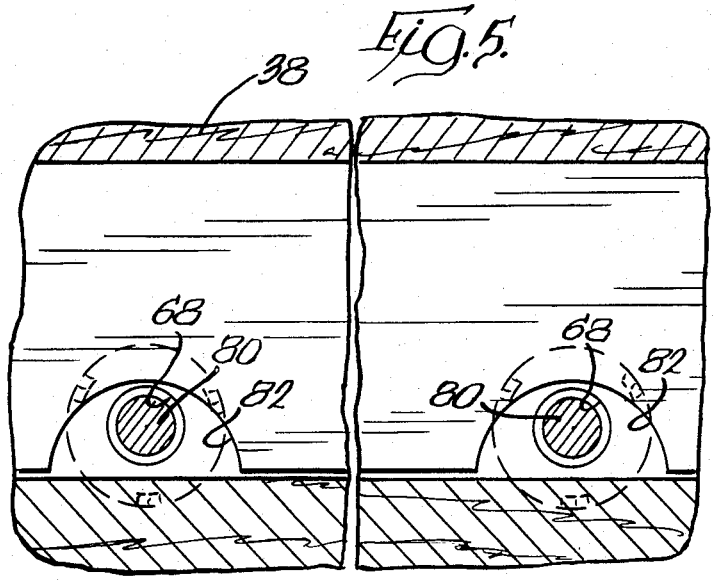
FIG. 5 is a cross sectional view taken substantially along the lines 5—5 of FIG. 4, showing further details of the manner of interconnection of the panels by fasteners.

Various materials possess shielding characteristics which serve the purpose of isolating a space against electrical, magnetic and electrostatic wave penetrations, such as copper, galvanized or stainless steel, sheet metal and close mesh screen, all of which are effective shielding materials. Accordingly, it is to be understood that any of the effective shielding materials may be utilized on the prefabricated panels of this invention, and that the illustration in the drawings of solid material is only by way of example.

Also, line filters, electrical isolation ventilators and power line conduits (none shown) may be provided in the side or ceiling panels, as well as an access door such as that shown in Lindgren U.S. Pat. No. 3,009,984 or U.S. Pat. No. 3,256,384 if a sliding door is desired, the teachings of both of which patents are specifically incorporated herein by reference, and the panels may have an inner wood frame or, if desired, a frame of sound insulating material as shown in Lindgren U.S. Pat. No. 3,322,879.

FIG. 1 illustrates one embodiment of electrically shielding screen room, indicated generally at 20, constructed in accordance with the teachings of the invention. Referring also to FIG. 2, the room includes four identical side wall panels 22, in one of which a door may be provided in accordance with the teachings of aforementioned U.S. Pat. No. 3,009,984. The room also includes four identical side wall/corner panels 24, a ceiling panel 26, two ceiling end panels 28, a floor panel 30 identical to the ceiling panel 26 and two floor end panels 32 respectively identical to the two ceiling end panels 28. As will be described, the various marginal edges of the side, ceiling and floor panels are selectively provided with either a male configuration (tongue) or a female configuration (groove), which are interconnectable to join the panels and provide excellent shielding characteristics for the room solely through the use of fasteners for clamping the panels together.

FIG. 3 illustrates the male and female marginal edge configurations which are selectively provided on the various panels. Each panel includes an inner frame 34 of electrically insulating material such as wood, the outer surface of which is covered with an outer sheet of shielding material 36 and the inner surface of which is covered with an inner sheet of shielding material 38. The marginal edge illustrated for the upper panel has a male configuration, and includes an elongate tongue 40 of wood received in a recess 42 medially in and along the edge of the frame and suitably secured therein, for example by an adhesive. Outwardly of the recess the tongue is tapered at 42 and 44, and terminates in an elongate end 48. The outer shielding 36 has an outer planar portion 36A which is bent at an outside corner 50 of the frame to extend perpendicularly inward at 36B, and again bent at an inside corner 52 to define a flange 36C along the tongue and parallel to the portion 36A, with an end of the flange terminating at about whereat the taper joins the elongate end. Similarly, the inner shielding 38 has an inner planar portion 38A bent at an outside corner 54 of the frame to extend perpendicularly inward at 38B, and again bent at an inside corner 56 to define a flange 38C along the tongue and parallel to the shield portion 38A, with an end of the flange terminating at about whereat the taper joins the elongate end. Consequently, the flanges 36C and 38C are spaced apart and electrically isolated from each other on opposite sides of the tongue.

The lower portion of FIG. 3 illustrates the configuration of a female marginal edge of a panel, and includes an elongate groove 58 formed in and medially along the edge of the frame. At the female end, the planar outer portion 36A of the shielding 36 is bent at an outside corner 60 of the frame to extend perpendicularly inward at 36D, and again bent at a corner 62 to define a flange 36E extending a portion of the way into and along a side wall of the groove. The planar inner portion 38A of the inner shielding 38 is in turn bent at an outside corner 64 of the frame to extend perpendicularly inward at 38D, and again bent at a corner 66 to define a flange 38E extending a portion of the way into and along an opposite side wall of the groove in a plane parallel to that of the portion 38A. Accordingly, the flanges 36E and 38E are spaced apart and electrically isolated from each other on opposite sides of the groove.

To accommodate clamping together interconnected male and female marginal edges of adjacent panels, prior to placement of the outer shielding 36 on the frames 34, but after placement thereon of the inner shielding 38, a plurality of bolt holes 68 are provided in spaced relationship through the inner shielding and the frame longitudinally along the groove 58 toward a bottom end 70 thereof. Outer ends of the bolt holes are mortised and drilled at 72, and each receives therein a "T" nut 74 having tines pressed into the underlying wood, to prevent turning of the nut, and a threaded sleeve portion 76 extending into the bolt hole toward but short of the groove. After the "T" nut is pressed into position such that a space exists between it and the outer surface of the frame, the space is filled with a dielectric wood mastic at 78 to hold the nut in position to receive a bolt 80 and to electrically isolate the nut from the outside shielding, whereafter the outside shielding is applied on the frame.

FIG. 4 illustrates associated male and female marginal edges of adjacent panels joined to securely fasten the panels together and to electrically connect and establish continuity of conduction between consecutive sections of the outer panel shields 36 and the inner panel shields 38, and at the same time maintain electrical isolation between the spaced apart inner and outer shields while eliminating or at least minimizing leakage at the junctures of the panels. To that end, the male marginal edges of the panels are extended into the female marginal edges of adjacent panels and the panels are pressed tightly together, for example by being drawn together with a chain and winch, until the shielding portions 36B and 36D of the outer shielding abut and the shielding portions 38B and 38D of the inner shielding abut, with the tapered portions of the tongue and overlying shielding facilitating movement of the male into the female marginal edges. At this point, the flanges 36E and 38E on the female marginal edge of each panel overlie, are parallel to and electrically connected with the respective flanges 36C and 38C on the male marginal edge of the adjacent panel to electrically connect consecutive sections of the outer shielding and consecutive sections of the inner shielding while maintaining electrical isolation between the inner and outer sections.

The elongate end 48 of the tongue 40 has a plurality of semicircular recesses 82 in spaced relationship longitudinally therealong, which recesses, when the panels are interconnected, align with the bolt holes 68. Thus, with the panels pressed tightly together, bolts 80 are extended through the bolt holes in the inner shielding 38 and the wood frame, through the semicircular recesses 82 in the elongate end 48 of the tongue and into threaded engagement with the sleeve portions 76 of the "T" nuts 74, and are then tightened to tightly compressibly clamp together the male and female marginal panel edges.

The particular structure of the panels and the manner in which they are interconnected provide coplanar pressure contact areas between the associated flanges 36C and 36E of the outer shield 36 and the associated flanges 38C and 38E of the inner shield 38, thereby to securely electrically connect consecutive outer sections of panel shielding one to the other and consecutive inner sections of panel shielding one to the other. Because the ends of the flanges 36C, 36E, 38C and 38E terminate short of the bolts 80, and the bolts electrically contact only the inner shielding 38, electrical isolation is maintained between the spaced apart inner and outer shields. Also, since the outer flanges 36C and 38C extend parallel to and away from the outer and inner portions 36A and 38A of the shieldings from which they are formed, no straight line path exists through the seams at the junctures of the panels for enhanced shielding characteristics of the room 20.

In addition to showing the connection between adjacent edges of panels, the upper portion of FIG. 4 illustrates an arrangement of a side wall/corner panel 24 for defining a corner of the screen room. The side wall/corner panel comprises a frame 83 of an electrically insulating material such as wood, which carries at one end a wooden block 84 suitably secured thereto by adhesive and a dowel pin 86. The block extends orthogonally from the frame to define an inside corner, and fastened to the frame and block at the inside corner is an L-shaped wooden block 88, defining with the block 84 a recess 42 in which a tongue 40 is secured. Outer and inner shielding materials 36 and 38 on the panel extend to and partially over the tongue, in the same manner as described in connection with the male marginal edge shown in FIG. 3, thereby to define a male marginal edge of the panel, with a female marginal edge (not shown) being at an opposite end of the panel. The right angle panel is connected with a side panel to define a corner of the screen room.

As above stated, the marginal edges of the various panels are appropriately provided with either a male or female configuration so that the same may be interconnected to form the screen room 20. Accordingly, one vertical edge of each side wall panel 22 has a male configuration and the other a female configuration, so that as many side wall panels as are required may be consecutively connected side by side to form a single wall of appropriate dimension for the room, while both the top and bottom of each side wall panel are provided with a female marginal edge. Each side wall/corner panel 24 has a vertical edge at the right angle corner defining a male configuration, the opposite vertical edge has a female configuration, and the top and bottom of the side wall/corner panels are provided with female marginal edges. Consequently, four side wall/corner panels may be interconnected with side wall panels 22 to define four vertical walls of the screen room 20, with the number of side wall panels used determining the overall dimensions of the room.

The ceiling and floor of the room 20, as shown in FIGS. 1 and 2, are identical, and therefore only the ceiling and its interconnection with the tops of side wall panels 22 and the side wall/corner panels 24 will be described. The two ceiling end panels 28 each includes a frame (not shown) of electrically insulating material, which is provided with an outer layer of shielding material 36 and an inner layer of shielding material 38 and has a generally U-shaped downwardly extending periphery terminating in a male marginal edge. The center ceiling panel 26 has downwardly extending peripheries at its opposite ends which terminate in male marginal edges and align with the peripheries of the end panels 28. In cross section, the peripheries of the center and end ceiling panels are represented by the right angle panel in the upper portion of FIG. 4.

The ceiling end panels 28 are fastened to the center ceiling panel 26 along junctures 92 and 94, whereat one of the ceiling end panels defines a male marginal edge and the other a female marginal edge for mating with respective female and male marginal edges on opposite sides of the center ceiling panel, which junctures are represented in cross section by the lower panel connection shown in FIG. 4. The resulting ceiling structure therefore defines a downwardly extending rectangular male marginal edge which is extended into and interconnected with the female marginal edges at the tops of the side wall and side wall/corner panels. It is appreciated, of course, that to accommodate reception of the male marginal edge of the ceiling within the female marginal edges at the upper ends of the side wall and side wall/corner panels, as well as to accommodate connection of the floor with lower ends of the side wall and side wall/corner panels, the tongues 40 of the side wall and side wall/corner panels terminate short of the tops and bottoms of the panels and generally flush with the bottoms 70 of the recesses 58 in the upper and lower female marginal edges. With the male marginal edges on the peripheries of the ceiling and floor received in the upper and lower female marginal edges of the side wall and side wall/corner panels, the same may be fastened together with bolts 80 and in cross section are represented by the upper portion of the structure shown in FIG. 4.

FIG. 1 shows the ceiling and floor mounted on the side wall and side wall/corner panels 22 and 24 to form the screen room 20. In the particular embodiment, the ceiling and floor each comprise three panels, the center panels of which are wider than the end panels, while the sides of the room each have only two panels. The arrangement obviates the need to underlay with copper and solder vertical seams 98 in the male marginal edges of the floor and ceiling, since when the room is assembled the seams are not aligned with the junctures between the side wall and side wall/corner panels and the shielding at the female marginal edges of the latter panels overlies the seams. However, it is understood that seams 98 at the four corners of the ceiling and floor would be underlaid with copper and soldered to ensure continuity of shielding thereat.

FIG. 6 illustrates another embodiment of shielded room which has three panels along each of its sides and four panels for each of the ceiling and floor panels to provide enlarged dimensions of the room. The construction of the panels, the arrangement of the shielding material on the outer and inner surfaces thereof and the manner of interconnection of the panels is substantially the same as described in respect of FIG. 1.

The invention therefore provides an improved structure for a double isolated shielding enclosure, which enables separate panels to be conveniently interconnected to form the enclosure without need for separate side wall, corner or other shielding strips, but only fasteners to clamp the panels together.

While embodiments of the invention have been described in detail, various modifications and other embodiments thereof may be devised by one skilled in the art without departing from the spirit and scope of the invention, as defined in the appended claims.

What is claimed is:

1. In a double isolated electrically shielding screen room, at least first and second panels adapted to be interconnected along marginal edges thereof, said panels including respective first and second frames of electrical insulating material, said first frame having a tongue extending medially along and outwardly of at least one marginal edge thereof and said second frame having a groove extending medially along and inwardly of at least one marginal edge thereof, and shielding covering sides of said frames, said shielding on said first frame terminating in flanges spaced apart and electrically isolated from each other on opposite sides of said tongue and extending only a portion of the way toward an outer end of said tongue and said shielding on said second frame terminating in flanges spaced apart and electrically isolated from each other on opposite sides of said groove and extending only a portion of the way toward an inner end of said groove, said tongue and flanges thereon of said first panel being extended into said groove and flanges therein of said second panel to interconnect said panels along said at least one marginal edges thereof, to electrically connect the flanges on one side of each of said tongue and groove, and to electrically connect the flanges on an opposite side of each of said tongue and groove, whereby said shielding on the same sides of said panels is electrically connected but electrically isolated from said shielding on opposite sides of said panels, wherein said electrically connected flanges overlap and extend in generally parallel planes, and including a plurality of passages through and spaced longitudinally along said tongue outwardly of said flanges thereon, and clamping means normal to said groove in said second panel for compressibly clamping together said overlapped and electrically connected flanges, said clamping means comprising a first plurality of fasteners in said second frame to one side only of and spaced longitudinally along said groove inwardly of said flanges therein and in alignment with respective ones of said passages through said tongue, each of said first plurality of fasteners being out of contact with said shieldings, and a second plurality of fasteners extended through said second frame and said shielding thereon to an opposite side of said groove, said second plurality of fasteners being spaced longitudinally along said groove in alignment with respective ones of said tongue passages and said first plurality of fasteners and extending through said passages into engagement with said first plurality of fasteners, wherein outer ends of said second plurality of fasteners are outwardly of said shielding on said second frame to said opposite side of said groove and are manipulatable to move said first and second pluralities of fasteners together to compressibly clamp together said overlapped flanges into secure electrical contact and substantially radio frequency leakproof relationship.

2. In a screen room as in claim 1, wherein said first panel tongue is tapered inwardly toward an outer end thereof and said flanges on opposite sides thereof overlie said taper to facilitate extension of said tongue into said second panel groove.

3. In a screen room as in claim 2, wherein said first plurality of fasteners comprise "T" nuts and said second plurality of fasteners comprise bolts.

4. In a double isolated electrically shielding screen room, a plurality of panels adapted to be interconnected along marginal edges thereof, each said panel being characterized by a frame of electrical insulating material having a tongue extending medially along and outwardly of a first marginal edge thereof and a groove extending medially along and inwardly of a second and opposite marginal edge thereof, and shielding covering opposite sides of said frame, said shielding terminating along said first marginal edge in flanges spaced apart and electrically isolated from each other on opposite sides of said tongue and extending only a portion of the way toward an outer end of said tongue and along said second marginal edge in flanges spaced apart and electrically isolated from each other on opposite sides of said groove and extending only a portion of the way toward an inner end of said groove, said tongue and associated flanges thereon defining a male marginal edge of said panel and said groove and associated flanges therein defining a female marginal edge of said panel, a plurality of said panels being joined edge to edge by extending said male marginal edge of a panel into said female marginal edge of an adjacent panel to interconnect said panels, to electrically connect the flanges on one side of each mating tongue and groove, and to electrically connect the flanges on an opposite side of each mating tongue and groove, whereby said shielding on the same sides of all of said joined panels is electrically connected but electrically isolated from said shielding on opposite sides of said panels, wherein said electrically connected flanges of each mating tongue and groove overlap and extend in generally parallel planes, and including a plurality of passages through and spaced longitudinally along each said tongue outwardly of said flanges thereon, and clamping means normal to each said groove for compressibly clamping together said overlapped and electrically connected flanges of each mating tongue and groove, said clamping means, for each mating tongue and groove, comprising a first plurality of fasteners in said frame having said groove to one side only of and spaced longitudinally along said groove inwardly of said flanges therein and in alignment with respective ones of said passages through said tongue, each of said first plurality of fasteners being out of contact with said shieldings, and a second plurality of fasteners extended through said frame and said shielding thereon to an opposite side of said groove, said second plurality of fasteners being spaced longitudinally along said groove in alignment with respective ones of said tongue passages and said first plurality of fasteners, and extending through said passages into engagement with said first plurality of fasteners, wherein outer ends of said second plurality of fasteners are outwardly of said shielding on said frame to said opposite side of said groove and are manipulatable to move said first and second pluralitites of fasteners together to compressibly clamp together said overlapped flanges of said mating tongue and groove into secure electrical contact and substantially radio frequency leakproof relationship.

5. In a screen room in claim 4, wherein said tongue of each said panel is tapered inwardly toward an outer end thereof and said flanges on opposite sides thereof overlie said taper to facilitate extension of said male marginal edges of said panels into said female marginal edges of adjacent panels.

6. In a screen room as in claim 4, wherein said plurality of panels includes first and second pluralitites of panels, said panels of said first plurality comprising generally rectangular side wall panels for said screen room, each having said male and female marginal edges at opposite side edges thereof, and said panels of said second plurality comprising side wall/corner panels for said screen room, being L-shaped in horizontal cross section to define a corner of said screen room, generally rectangular to opposite sides of said corner and having said male and female marginal edges at opposite side edges thereof, four of said side wall/corner panels of said second plurality, establishing four corners of said screen room, having interconnected therebetween a plurality of side wall panels of said first plurality by male to female interconnections between adjacent panels to establish four walls of said screen room.

7. In a screen room as in claim 6, including female marginal edges at the top and bottom of each panel of said first and second pluralities, and said plurality of panels also including ceiling and floor panels for said screen room, each said ceiling and floor panel comprising a generally rectangular frame of electrical inulating material having a tongue extending generally orthogonally from the peripheral edge thereof, and shielding covering opposite sides of said frame, said shielding terminating in flanges spaced apart and electrically isolated from each other on opposite sides of said tongue and extending only a portion of the way toward an outer end of said tongue and said tongue and flanges defining a male marginal edge, said male marginal edges of said ceiling and floor panels and said top and bottom female marginal edges of said side wall and side wall/ceiling panels being similarly rectangularly dimensioned, whereby said male marginal edges of said ceiling and floor panels may be respectively extended into and interconnected with said top and bottom female marginal edges of said side wall and side wall/ceiling panels to provide a screen room having four side walls, a ceiling and a floor with inner and outer electrically isolated shieldings.

8. In a screen room as in claim 4, wherein said first plurality of fasteners comprise "T" nuts and said second plurality of fasteners comprise bolts.

* * * * *